United States Patent [19]

Ramesh

[11] Patent Number: 4,888,302

[45] Date of Patent: Dec. 19, 1989

[54] METHOD OF REDUCED STRESS RECRYSTALLIZATION

[75] Inventor: Subramanian Ramesh, Ossining, N.Y.

[73] Assignee: North American Philips Corporation, New York, N.Y.

[21] Appl. No.: 330,961

[22] Filed: Mar. 29, 1989

Related U.S. Application Data

[63] Continuation of Ser. No. 125,271, Nov. 25, 1987, abandoned.

[51] Int. Cl.$^4$ .................... H01L 21/20; H01L 21/324
[52] U.S. Cl. ................ 437/82; 148/DIG. 4; 148/DIG. 48; 148/DIG. 71; 148/DIG. 152; 427/55.1; 156/603; 156/620; 437/83; 437/174; 437/247; 437/942; 437/963; 437/973
[58] Field of Search .............. 148/DIG. 4, 24, 46, 148/48, 71, 74, 90, 93, 47, 52, 54, 33.3; 156/603, 610–614, 617 R, 620; 427/53.1; 437/14, 25, 82, 83, 84, 173, 174, 247, 408, 942, 963, 973

[56] References Cited

U.S. PATENT DOCUMENTS

| | | | |
|---|---|---|---|
| 4,120,743 | 10/1978 | Baghdadi et al. | 156/620 |
| 4,257,824 | 3/1981 | Jackson et al. | 437/173 |
| 4,330,363 | 5/1982 | Biegesen et al. | 156/620 |
| 4,371,421 | 2/1983 | Fan et al. | 156/624 |
| 4,461,670 | 7/1984 | Celler et al. | 156/603 |
| 4,473,433 | 9/1984 | Bosch et al. | 427/53.1 |
| 4,479,846 | 10/1984 | Smith et al. | 437/82 |
| 4,578,143 | 3/1986 | Arai | 156/620 |
| 4,578,144 | 3/1986 | Hiramoto | 427/53.1 |
| 4,589,951 | 5/1986 | Kawamura | 156/620 |
| 4,659,422 | 4/1987 | Sakurai | 156/620 |
| 4,678,538 | 7/1987 | Haond et al. | 156/620 |
| 4,707,217 | 11/1987 | Aklufi | 156/DIG. 73 |

FOREIGN PATENT DOCUMENTS

| | | | |
|---|---|---|---|
| 0121822 | 7/1984 | Japan | 437/973 |
| 0136305 | 7/1985 | Japan | 156/603 |
| 0154016 | 9/1984 | Japan | 437/973 |
| 0141117 | 6/1986 | Japan | 437/973 |
| 0025564 | 2/1977 | Japan | 156/620 |

OTHER PUBLICATIONS

Haond et al., "Use of Incoherent Light for Annealing Implanted Si Wafers and Growing Single-Crystal Si or SiO$_2$", Electron. Lett., Aug. 19, 1982, vol. 18, No. 17, pp. 727–728.

Pinizotto et al., "Subgrain Boundaries in Laterally Seeded Silicon-or-Oxide Formed by Graphite Strip Heater Recrystallization", Appl. Phys. Lett., 40(5), Mar. 1, 1982, pp. 388–390.

*Primary Examiner*—Brian E. Hearn
*Assistant Examiner*—William D. Bunch
*Attorney, Agent, or Firm*—Norman N. Spain

[57] ABSTRACT

A defect free monocrystalline layer of silicon on an insulator is produced by forming a thin layer of silicon dioxide on a monocrystalline silicon substrate, forming a thin layer of polycrystalline or amorphous silicon on the silicon dioxide layer and focussing two beams from lamps on the thin silicon layer to form a line image providing a melt zone surrounded by two narrow heated zones having temperatures lower than the melt zone and having a temperature differential of from 2°–10° C./mm decreasing form the melt zone while heating the substrate to a temperature below that of the zones heated by the lamps and scanning the structure.

9 Claims, 2 Drawing Sheets

TEMPERATURE OF SILICON FILM VS. DISTANCE FROM CENTRE OF MELT

METHOD OF REDUCED STRESS RECRYSTALLIZATION

This is a continuation of application Ser. No. 125,271, filed Nov. 25, 1987, now abandoned.

BACKGROUND OF THE INVENTION

The invention of this application is concerned with a method of producing, defect free monocrystalline layers of semiconductor materials on insulating layers. In particular the invention is concerned with the formation of thin monocrystalline layers of silicon on insulators, the so called SOI structure.

In the production of thin layers of monocrystalline silicon on insulating layers a thin layer of polycrystalline or amorphous silicon is deposited on an insulating substrate particularly monocrystalline silicon, oxidized silicon or quartz. By localized heating of the silicon layer a small molten zone is produced in the silicon layer which molten zone is scanned across the silicon layer while the underlying substrate is heated. As the molten layer of silicon recrystallizes the silicon layer is converted to a monocrystalline layer.

Such a procedure is well-known in the art, examples in being shown in European Application EPA-0129261, Anthony, U.S. Pat. No. 4,585,493, Klein, U.S. Pat. No. 4,590,130, J. Sakurai, J. Electrochem Soc. Solid-State Science and Technology, pp. 1485–1488 (July, 1986), C.L. Bleil et al, Mat. Res. Soc. Symp. Proc. Vol. 35, pp. 389–692 and Japanese Kokai 61-19116.

The problem with these prior arts is that while the zone melting methods disclosed produce monocrystalline layers the monocrystalline layers contain an undesirable concentration of defects. These defects are found primarily to be the presence of sub-grain or low angle grain boundaries. These sub-grain boundaries are believed to arise due to stresses in the growing crystal. These stresses are believed to be chemical impurities, surface, surface roughness, volume expansion or freezing of thermal gradients.

The Japanese Kokai, C. L. Bleil et al. and J. Sakurai show examples of the use of low melting glasses such as phosphosilicate glass, borophosphosilicate glass or corning 7059 as substrates underlying the recrystallizable silicon layer. It is taught in these references that by the use of these substrates an alternate mechanism for stress relief is provided so that the formation of low angle grain boundaries will be eliminated or significantly reduced. However, while the use of these substrates results in the reduction of some formation of low angle grain boundaries the formation of these low angle grain boundaries has not been eliminated or even significantly reduced.

The method significantly reducing the formation of low angle grain boundaries is disclosed in copending U.S. Application No. 084,657 filed Aug. 11, 1987 and commonly assigned. According to the method disclosed in this copending application, the formation of low angle grain boundaries may be significantly reduced so that thin defect free monocrystalline layers of semiconductor materials of significantly large areas and insulators may be produced. According to the invention, as described in this application, the method involves depositing a thin monocrystalline or amorphous layer of a semiconductor material on a low softening point temperature insulating substrate having a softening point of at least 10° C. below the melting point of a semiconductor material and the slope of its viscosity versus temperature curve being less than zero and greater than negative infinity, heating the layer of the semiconductor material by means of a zone heating source in such a manner as to provide a convex solid-liquid interface on the layer of the semiconductor material while the layered structure is scanned relative to the zone heating source, the substrate is heated to its annealing point and the scanning speed of the structure relative to the zone heating source is controlled in order to cause the convex solid liquid interface to move along the layer of semiconductor material while the surface of the substrate imposing the layer of the semiconductor material is liquified over the solid-liquid interface.

While this method clearly increases the distance between the defects resulting in the recrystallization to the presence of sub-grain boundaries this method does not prevent the formation of the sub-grain boundaries. By use of this method a 500 μm wide layer of defect free monocrystalline zone was produced with a length of 2 mm. However, for many purposes it is highly desirable that area of defect free monocrystalline silicon be significantly increased.

SUMMARY OF THE INVENTION

An object of this invention is to provide a method for the formation of thin defect free monocrystalline layers of semiconductor materials on insulating substrates.

According to the invention the applicant has developed a novel method of forming thin defect free monocrystalline layer of a semiconductor material on an insulator.

More particularly according to the invention, the novel method involves the combination of (a) depositing a thin polycrystalline or amorphous layer of a semiconductor material on an insulating substrate to form a layered structure; (b) focusing beams from two lamps on the layer of semiconductor material in such a manner that the center of the beams coincide to form a line image on the layer of semiconductor material the power distribution of these lamps being such as to provide a narrow melt zone in said layer of semiconductor material at the center of the coincided line image surrounded by two narrow heated zones the temperature of the heated zones being below the temperature of the melt zone and the heated zones having a temperature differential of from 2°–10° C./mm decreasing from the melt zone in said layered structure direction perpendicular to said line image and heating said substrate to a temperature below the temperature of said heated zone.

The applicant found that by the use of the narrow heated zone surrounding the melt zone the presence of a sharp temperature differential is avoided and as a result thereof the formation of defects such as sub-grain boundaries is prevented. The area free of subgrain boundaries is determined only by the length of the line image formed on the layer of semiconductor material.

While the method of the invention is for forming defect free monocrystalline layers of semiconductor materials generally including silicon and germanium it is particularly adapted for forming thin defect free monocrystalline layers of silicon on an insulating substrate.

DETAILED DESCRIPTION OF THE INVENTION

Figure 1:
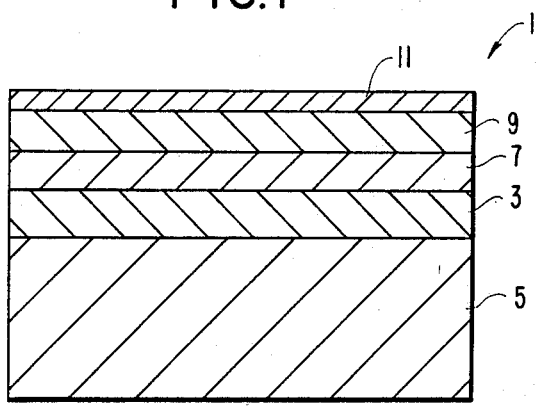
FIG. 1 is a cross-sectional view of a layered structure used in carrying out the method of the invention.

For a more complete understanding the invention will now be described in greater detail.

Various materials well-known in the art may be employed as a substrate. Examples of such materials being quartz, glass, including phosphosilicate glass, monocrystalline silicon and sapphire.

In general, the thickness of the substrate is about 0.02-2 mm. However the thickness of the substrate may vary considerably from this range. Generally the thickness of the polycrystalline or amorphous semiconductor layer is about 0.5-4 $\mu$m however, here too a considerable deviation from these values.

While the layered structure subject to the method of the invention may consist simply of a layer of the semiconductor material on an insulating substrate. Particularly, in those cases where the semiconductor layer is a layer of polycrystalline or amorphous silicon, in order to prevent contamination of the silicon layer the silicon layer may be sandwiched between two layers of silicon dioxide. For further prevention of contamination from the atmosphere this layered structure may be topped with a protective layer such as a thin layer of silicon nitride.

When the substrate is glass it is heated to its annealing point. When the substrate is oxidized silicon it is generally heated to a temperature of about 1000° C.-1250° C. Both of these temperatures being below the temperature of the narrow heated zone surrounding the melt zone in the silicon layer.

When the layer to be recrystallized is silicon, the width of the narrow melt zone is 200-800 $\mu$m and the width of the narrow heated zones in the silicon layer is 0.8 to 3 mm. The length of the line image depends upon the apparatus employed. The apparatus employed in carrying out the method of the invention produced a line image of 100 mm thereby producing a sub-grain boundaries free monocrystalline layer of silicon of about 100 mm wide. While two lamps of proper power distribution may be chosen, it has been found that for best results an arc lamp should be employed together with a filament lamp, the narrow beam from the arc lamp serving to provide the melt zone and the wider beam from the filament lamp serving to provide the narrow heated zones. The combination of a mercury arc lamp and a tungsten halogen lamp has been found to be particularly useful for carrying out the method of the invention.

A preferred embodiment of the invention will now be described with reference to the figures of the drawing and the following example:

The layered structure 1 shown in FIG. 1 was produced in the following manner by low temperature chemical deposition technique a thin layer of silicon dioxide 3 of a thickness of 2 82 m was deposited on a 0.3 mm thick substrate of monocrystalline silicon 5, a thin layer of polycrystalline silicon 7 of a thickness of about 1.5 $\mu$m was deposited on the layer 3 of silicon dioxide, an additional layer of silicon dioxide 9 of a thickness of 2 $\mu$m was deposited on the layer of polycrystalline silicon 7 on the layer 1 of silicon dioxide 9 a capping layer 11 of silicon nitride of a thickness of about 600 angstroms was deposited.

Figure 2:
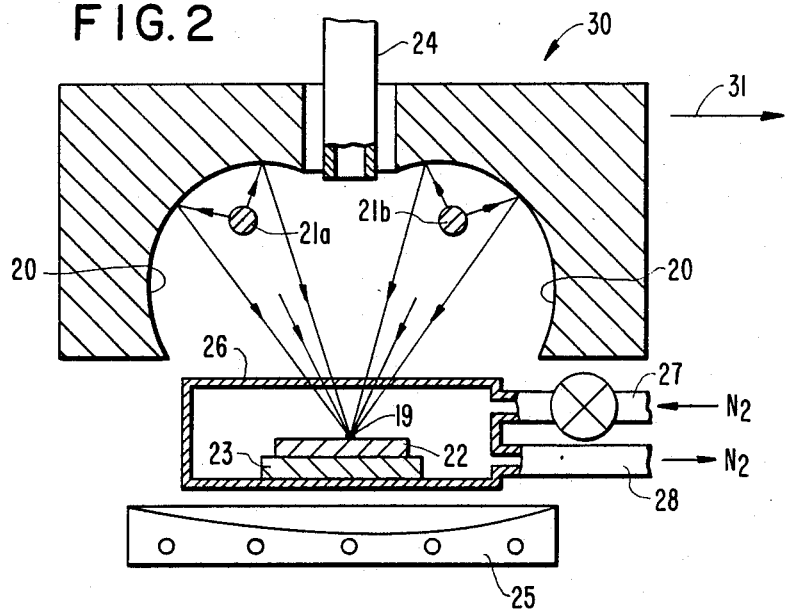
FIG. 2 illustrated diagrammatically, partially in section and not to scale, of an apparatus for carrying out a method embodying the invention.

Reference is now made to the copending application Ser. No. 096,179 filed Sept. 11, 1987, of which I am a coinventor which describes an apparatus suitable for carrying out the method of the invention. This apparatus, illustrated in FIG. 2, comprises an image head 30 having a pair of elliptical reflectors 20 with a 6 kilowatt mercury arc lamp 21a at the focus at one of said reflectors 20 and 1.5 kilowatt tungsten halogen lamp 21b placed at the focus of the reflector 20. The reflectors 20 are each part cylindrical with the axis of each perpendicular to the plane of the drawing having, as shown, in cross-section the shape of part of an ellipse and the lamps are tubular so that a coincident line image 19 is formed on the plane of the polycrystalline silicon layer 22 present in a four inch diameter sample 23 of the layered structure 1. Sample 23 which is to be processed is located within a quartz chamber 26. A viewing system 24 suitable for reflectivity or emissivity measurements is placed in the gaps between the two reflectors 20. A set of bias lamps 25, for example tungsten halogen, located under the quartz chamber 26 provides a means of heating the substrate of the sample 23. An inlet 27 for a supply of nitrogen and an outlet 28 is provided in the quartz chamber 26. The quartz chamber 26 is transparent to infrared and heat-UV radiation from the lamps 21a and 21b.

With the sample in place and the lamps in operation a line image of about 100 mm long was produced. The line image was scanned for example at a scan rate of 0.1 mm/sec which was achieved by moving the image head 30 in the direction indicated by arrow 31. While the line image was being scanned in this manner, the silicon substrate was heated to a temperature of about 1100° C. by the bias lamp.

A melt zone of less than 500 $\mu$m wide with a temperature 1410° C. was formed in the layer of polycrystalline silicon along the center of the line image. This melt zone was surrounded by two heated zone regions each about 2 mm wide with a maximum temperature of about 1390° C. and temperature differential of from 2°-10° C. per mm decreasing from the melt zone.

In the sample so processed, a defect free monocrystalline silicon layer of a width of about 100 mm and a length of about 4 inches was formed.

Figure 3:
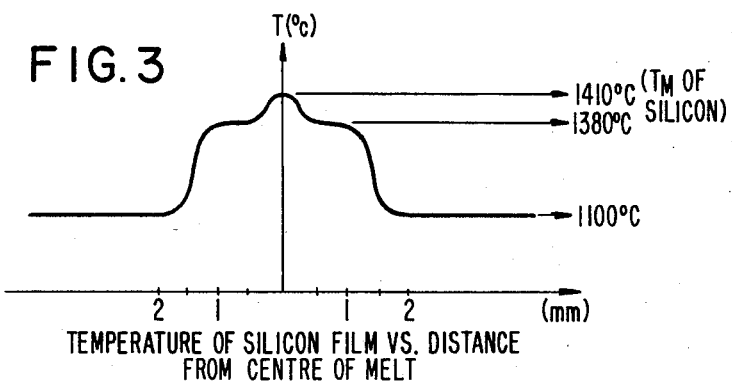
FIG. 3 is a graph showing the relative temperature distribution of the temperature in the melt zone the temperature of the heated narrow zone surrounding the melt zone in the semiconductor layer and the temperature of the heated substrate.

FIG. 3 is a graph showing the temperature of the melt at 1410° C. the maximum temperature of the heated areas surrounding the melt of 1390° C. and the temperature of the heated substrate at 1100° C., as formed in this example along with the width in millimeters of each of these zones.

Figure 4:
FIG. 4 is a photograph enlarged about 350 times of a monocrystalline silicon layer formed by the method of the invention and Schimmel etched to highlight the presence of subgrain boundaries if any.

FIG. 4 is a photograph enlarged 350 times of a 680 $\mu$m times 500 $\mu$m section of the resistant monocrystalline silicon layer. It should be noted from the photograph the resultant monocrystalline film layer is essentially defect free.

In a similar manner a defect free monocrystalline silicon layer of similar dimensions was provided on the layered structure formed of a glass substrate on (a silicon substrate with a 3 $\mu$m thick layer of phosphosilicate deposited on it) a 1 μm thick silicon dioxide layer deposited on the phosphosilicate glass layer, about a 2 μm thick layer of polysilicon deposited on the 1 mm layer of silicon dioxide about a 2 μm thick layer of silicon dioxide deposited on the layer of polysilicon and a capping layer of silicon nitride of about 600 angstroms thick deposited on the 2 μm layer of silicon dioxide.

What is claimed is:

1. A method of forming a thin, defect free, monocrystalline layer of a semiconductor material on an insulator, said method comprising:
   (a) depositing a thin polycrystalline or amorphous layer of a semiconductor material on an insulating substrate to form a layered structure;
   (b) focusing beams from an arc lamp and a filament lamp on the layer of semiconductor material in such a manner that the center of said beams coincide to form a line image on said line image, the power distribution on said layer being such as to provide a narrow melt zone in said layer of semiconductor material at the center of the line image surrounded by two narrow heated zones, the temperature of said narrow heated zones being below the temperature of said melt zone and said narrow heated zone having a temperature differential of from 2°–10° C./mm decreasing from said melt zone while scanning said layered structure relative to said line image and heating said substrate to a temperature below the temperature of said heated zone.

2. The method of claim 1 wherein the semiconductor material is silicon.

3. The method of claim 2 wherein the substrate is glass.

4. The method of claim 1 wherein the substrate is heated to a temperature of 1000° C.–1250° C.

5. The method of claim 2 wherein the melt zone is less than about 200–800 μm in width and the width of each of the narrow heated zones is about 2 mm wide.

6. The method of claim 2 wherein the substrate is oxidized silicon.

7. A method of forming a thin, defect free, monocrystalline layer of silicon on an insulator, said method comprising:
   (a) depositing a thin layer of silicon dioxide on a substrate of monocrystalline silicon;
   (b) depositing a thin layer of polycrystalline or amorphous silicon on said layer of silicon dioxide to form thereby a layered structure;
   (c) focusing beams from an arc lamp and a filament lamp on said layer of polycrystalline or amorphous silicon in such a manner that the beams from both lamps impinge on said layer of polycrystalline or amorphous silicon prior to infringing on said substrate and the centers of said beams coincide to form a line image on said layer, the power distribution on said layer being such as to provide a narrow melt zone in said layer of at the center of the line image surrounded by two narrow heated zones, the temperature of said narrow heated zones being below the temperature of said melt zone and said narrow heated zone having a temperature differential of from 2°–10° C./mm decreasing from said melt zone while scanning said layered structure relative to said line image and heating said substrate to a temperature below the temperature of said heated zone.

8. The method of claim 7 wherein the substrate is heated to about 1100° C.

9. The method of claim 8 wherein the width of the melt zone is from about 400–500 μm.

* * * * *